United States Patent [19]
Hiraga

[11] Patent Number: 6,081,012
[45] Date of Patent: Jun. 27, 2000

[54] SEMICONDUCTOR INTEGRATED CIRCUIT DEVICE

[75] Inventor: Noriaki Hiraga, Kyoto, Japan

[73] Assignee: Rohm Co., Ltd., Kyoto, Japan

[21] Appl. No.: 09/130,477

[22] Filed: Aug. 7, 1998

[30] Foreign Application Priority Data

Aug. 8, 1997 [JP] Japan .................................. H9-214334

[51] Int. Cl.[7] .............................. H01L 27/02; H01L 23/48
[52] U.S. Cl. .......................................................... 257/355
[58] Field of Search ............................................. 257/355

[56] References Cited

U.S. PATENT DOCUMENTS 4,443,811  4/1984  Tubbs et al. .
4,591,894  5/1986  Kawakami .

FOREIGN PATENT DOCUMENTS 2-23663   1/1990  Japan .
2246360  10/1990  Japan .

Primary Examiner—Stephen D. Meier
Attorney, Agent, or Firm—Arent Fox Kintner Plotkin & Kahn, PLLC

[57] ABSTRACT

A semiconductor integrated circuit device has a plurality of types of power supply systems. In a corner area of a semiconductor integrated circuit chip, a diode region is formed that consists of a P region and an N region. On this diode region, a power-source line and a ground line are laid so that these lines and the diode region are coupled with a first wiring layer between them and thereby a static protection diode is added to the power supply systems.

4 Claims, 7 Drawing Sheets

SEMICONDUCTOR INTEGRATED CIRCUIT DEVICE

BACKGROUND OF THE INVENTION

1. Field of the Invention

The present invention relates to a semiconductor integrated circuit device such as an LSI (large-scale integrated circuit).

2. Description of the Prior Art

Many semiconductor integrated circuit devices are provided with, not only a single power supply system, but a plurality of power supply systems. This is, for example, to supply different types of electric power between digital circuits and analog circuits, or to use different power supply systems between I/O circuits and internal logic circuits. Where there are a plurality of power supply systems, each system exhibits a different level of resistance to static electricity. It is known that, in an LSI or similar device, formation of a component is accompanied with formation of a parasitic diode or bipolar transistor, and that such parasitic elements operate beneficially against electrostatic destruction.

How fully parasitic diodes are formed varies from one power supply system to another. For example, among the power supply systems shown in FIGS. 9A to 9C, the one shown in FIG. 9A has the largest parasitic-diode portion 101A added to its protection circuit 100, the one shown in FIG. 9C has almost no parasitic-diode portion, and the one shown in FIG. 9B has a parasitic-diode portion 101B half the size of that shown in FIG. 9A.

Against static electricity, the power supply system shown in FIG. 9A exhibits sufficient resistance, but the power supply system shown in FIG. 9C does not. In an LSI, destruction of only one power supply system, most probably the least resistant one, makes the entire LSI useless. Accordingly, it is desirable to strengthen the resistance of poorly resistant power supply systems by adding diodes in the I/O circuit and in the logic circuit, but this cannot be achieved without increasing the chip area.

SUMMARY OF THE INVENTION

An object of the present invention is to provide a semiconductor integrated circuit device in which the overall resistance of the power supply systems to static electricity is improved without increasing the area of the entire circuit.

To achieve the above object, according to one aspect of the present invention, in a semiconductor integrated circuit device having a plurality of types of power supply systems, a diode region that consists of a P region and an N region is formed in a corner area of a semiconductor integrated circuit chip, and, on this diode region, a power-source line is laid so that the power-source line and the diode region are coupled and thereby a static protection diode is added to the power supply systems.

This makes it possible to effectively use the corner areas of a semiconductor integrated circuit chip to add static protection diodes and thereby make power supply systems sufficiently resistant to static electricity. In this way, by effectively using the corner areas of a semiconductor integrated circuit chip to add static protection diodes, it is possible to improve the resistance of power supply systems to static electricity without increasing the chip area.

In this case, it is preferable that a plurality of diode regions are formed along a predetermined direction, and that a pair of power-source/ground lines for a power supply system having low resistance to static electricity be so arranged as to have as many intersections as possible with those diode regions. This makes it possible to add a number of diodes to a power supply system that has low resistance to static electricity on its own.

Moreover, it is preferable that the pair of power-source/ground lines run in an L-shaped path along the outer edges of the corner area of the semiconductor integrated circuit chip, and that the diode regions include a group of diode regions that are formed along a first direction perpendicular to the pair of lines and a group of diode regions that are formed along a second direction perpendicular to the first direction. This makes it possible to add a larger number of diodes to a power supply system that has low resistance to static electricity.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
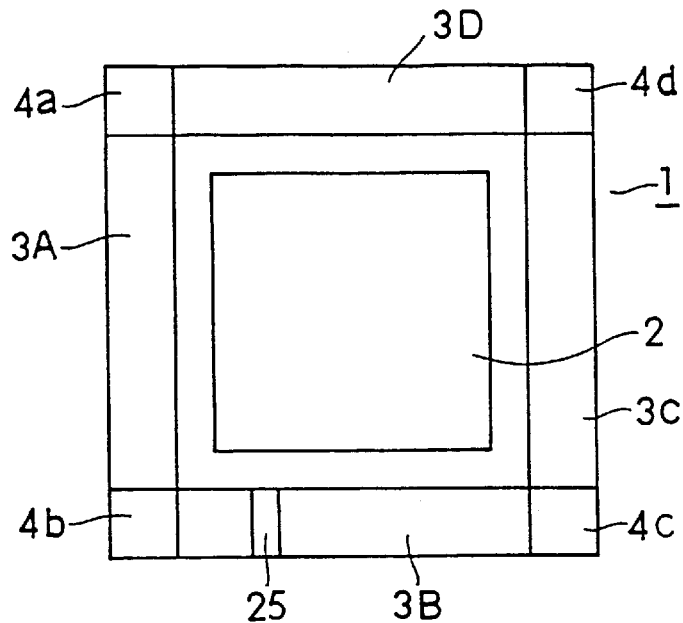
FIG. 1 is a diagram schematically illustrating a semiconductor integrated circuit device embodying the present invention.

Hereinafter, embodiments of the present invention will be described with reference to the drawings. FIG. 1 schematically illustrates an LSI chip 1. The LSI chip 1 has a core section 2 (logic circuits) and I/O sections 3A to 3D. The LSI chip 1 also has corner areas 4a to 4d. These corner areas 4a to 4d are generally left unused, but, in this embodiment, they are used, as will be described later, to form diode regions therein. On these corner areas 4a to 4d are laid wiring patterns such as those for supplying power.

Figure 5:
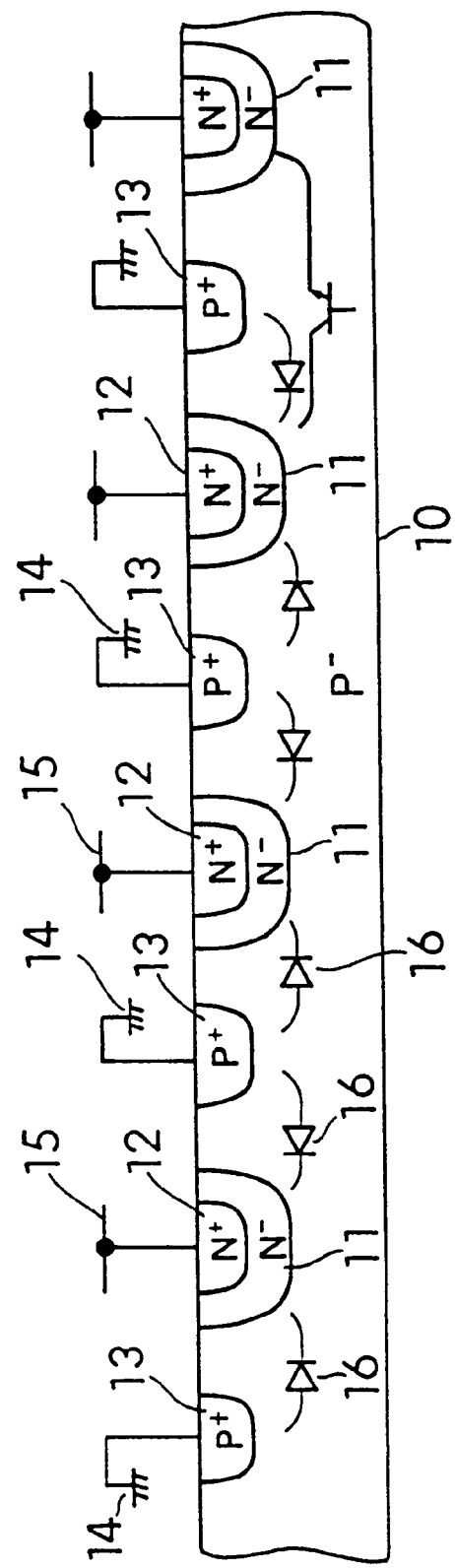
FIG. 5 is a diagram illustrating an example of the structure in section of the diode regions formed in the corner area in a semiconductor integrated circuit device according to the invention.

FIG. 5 shows a section of one example of the above-mentioned corner area. In a $P^-$ substrate 10, $N^-$ layers 11 are formed, and, within these $N^-$ layers, $N^+$ contact layers 12 are formed. Also formed in the $P^-$ substrate are $P^+$ contact layers 13. These P+ contact layers 13 are connected to a ground line 14, and the N+ contact layers 12 are connected to a power-source line 15. As a result, diodes 16 are formed as shown in the figure. Thus, the N− layers 11, together with parts of the substrate adjoining them, constitute diode regions.

Figure 6:
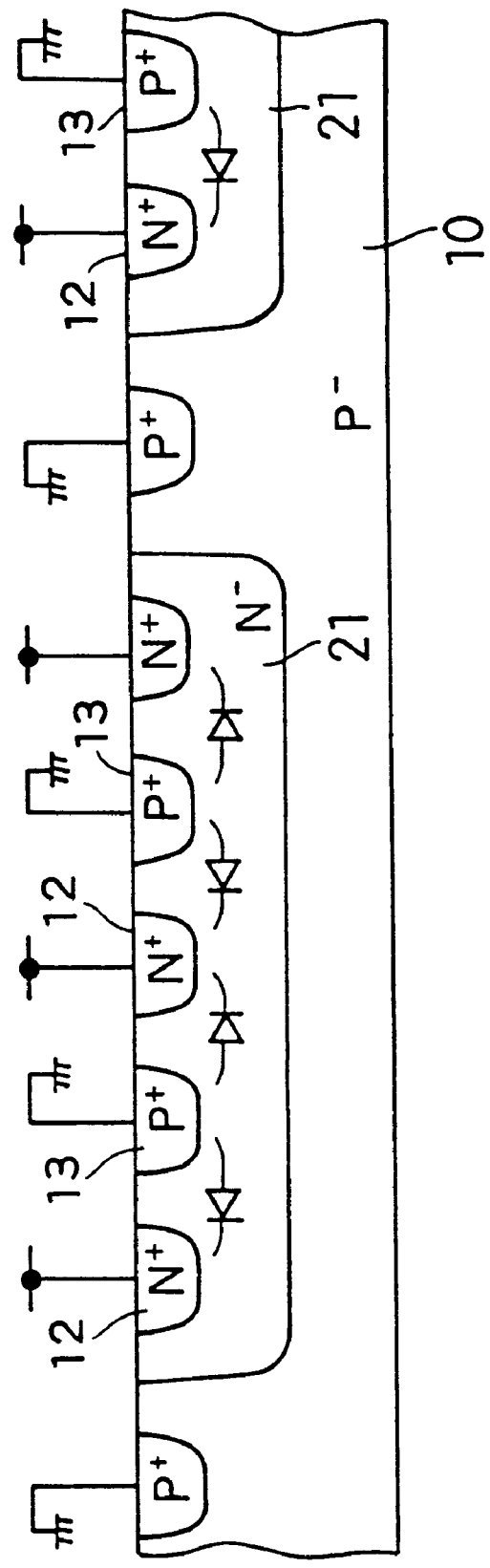
FIG. 6 is a diagram illustrating another example of the structure in section of the diode regions formed in the corner area in a semiconductor integrated circuit device according to the invention.
Figure 7:
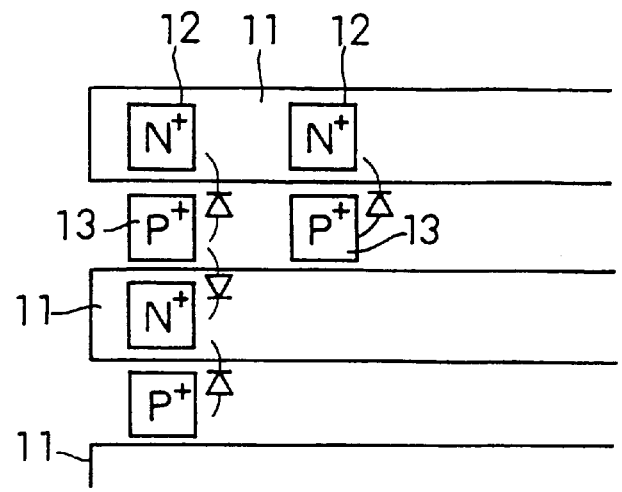
FIG. 7 is a plan view of a part of the structure shown in FIG. 5.

FIG. 6 shows a section of another example of the corner area. Here, in a P− substrate 10, an N well 21 is formed, and within this N well 21, a plurality of N+ contact layers 12 and P+ contact layers 13 are formed. FIG. 7 is a plan view of the structure shown in FIG. 5, and shows that the contact layers 12 and 13 each have a rectangular shape. By way of these contact layers 12 and 13, the wiring patterns 17 and 18 (see FIG. 8) formed in a first wiring layer are coupled together.

Figure 8:
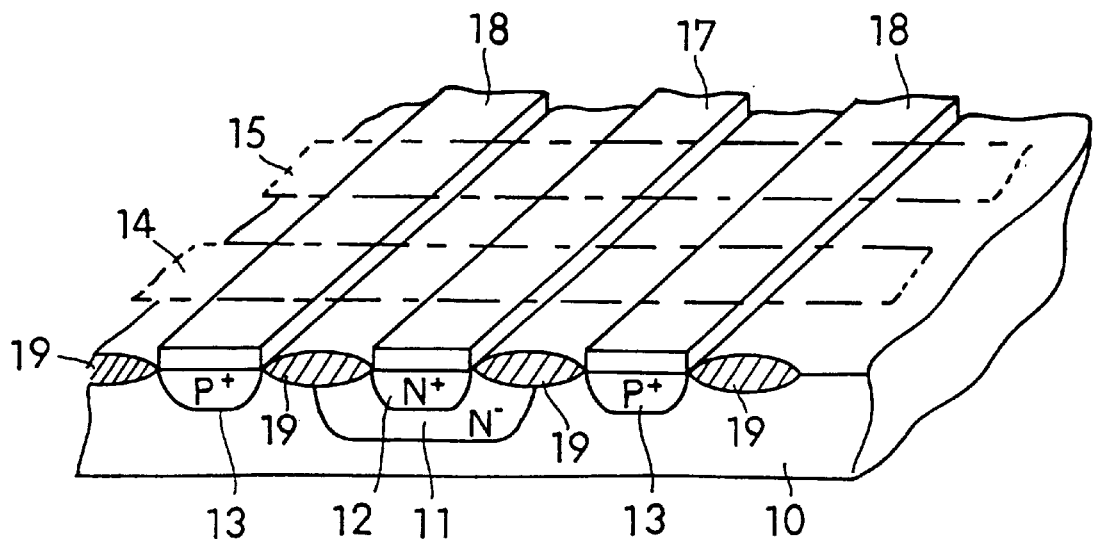
FIG. 8 is a perspective view schematically illustrating how the structure of FIG. 5 looks after wiring patterns have been laid.
Figure 9A:
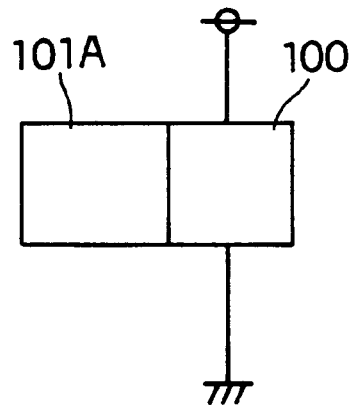
FIGS. 9A, 9B, and 9C are diagrams illustrating the relationship between conventional power supply systems and parasitic diodes.
Figure 9B:
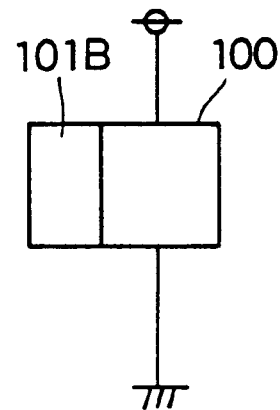
Figure 9C:
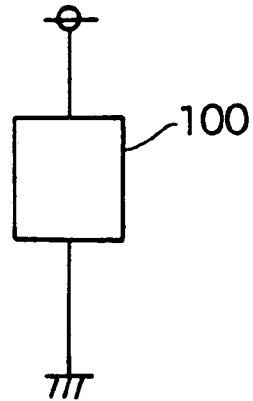

In FIG. 8, numeral 19 represents a separator layer made of an insulating material. Numerals 14 and 15 represent a ground line and a power-source line, respectively, formed in a second wiring layer. The pair of these ground and power-source lines 14 and 15 constitutes one power supply system. The wiring patterns 17 and 18 in the first wiring layer and the ground and power-source lines 14 and 15 in the second wiring layer are interconnected in a desired manner by way of via holes (not shown).

Figure 3:
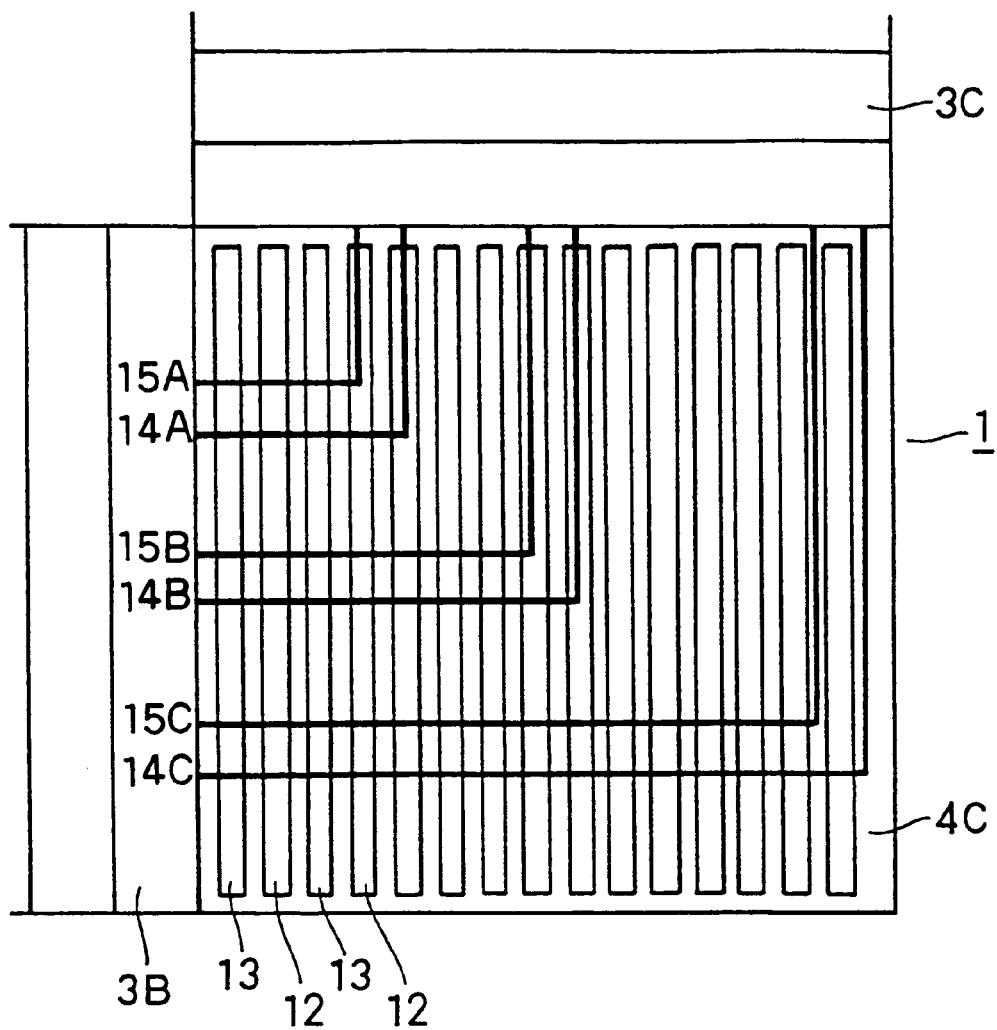
FIG. 3 is a diagram illustrating the wiring structure in the corner area of the semiconductor integrated circuit device of a first embodiment of the invention.
Figure 4:
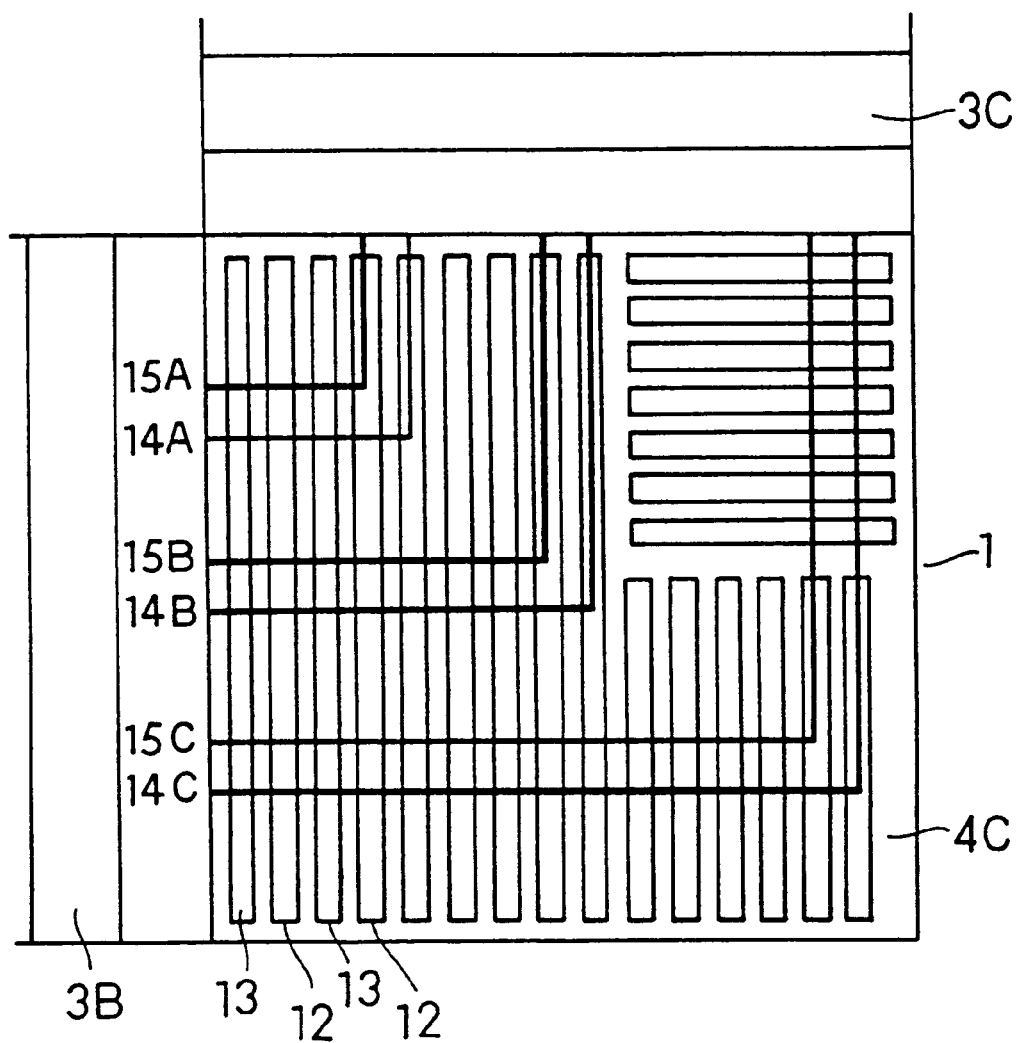
FIG. 4 is a diagram illustrating the wiring structure in the corner area of the semiconductor integrated circuit device of a second embodiment of the invention.

FIG. 3 illustrates the wiring structure in the corner area 4c of the LSI chip 1 shown in FIG. 1. Here, wiring patterns 12 and 13 are arranged alternately longitudinal stripes in the first wiring layer, and three pairs of ground and power-source lines (14A and 15A, 14B and 15B, and 14C and 15C), for three separate power supply systems, are arranged in L-shaped paths parallel to one another. Although the power-source and ground lines of the power supply systems are formed in the second wiring layer, the more often they cross the wiring patterns 12 and 13 in the first wiring layer (i.e. the more intersections they have with the wiring patterns 12 and 13), the more diodes are connected to them (i.e. the more diodes are added thereto).

Accordingly, it is preferable that the ground line 14A and the power-source line 15A of a power supply system for logic circuits, which is highly resistant to static electricity on its own and therefore to which no diodes or only a small number of diodes need to be added in the corner area 4c, be arranged near the inner edges of the corner area 4c where there are fewer intersections with the wiring patterns 12 and 13 in the first wiring layer as shown in the figure. On the other hand, it is preferable that the ground line 14C and the power-source line 15C of a power supply system that is poorly resistant to static electricity on its own be arranged near the outer edges of the corner area 4c where there are more intersections with the wiring patterns 12 and 13. Thus, it is preferable that the ground line 14B and the power-source line 15B of a power supply system that is moderately resistant to static electricity be arranged in between.

Figure 2:
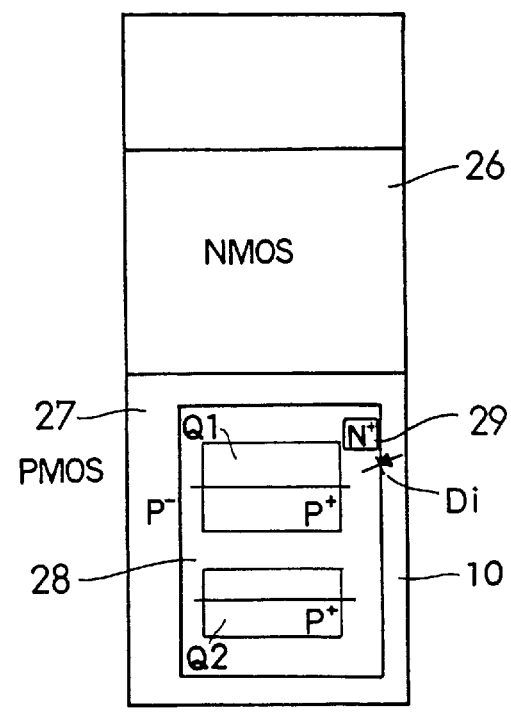
FIG. 2 is a diagram illustrating the I/O cell of the semiconductor integrated circuit device of the invention.

An example of the power supply system (14B and 15B) and the power supply system (14C and 15C) will be described below with reference to FIG. 2. FIG. 2 illustrates a part of one I/O cell 25 taken out of the I/O section 3B shown in FIG. 1. The I/O cell has an NMOS portion 26 and a PMOS portion 27. In the PMOS portion 27, two transistors Q1 and Q2 are formed so as to share a single N well 28.

Assume that the transistor Q1 is for holding a voltage and the transistor Q2 is for switching. In this case, the transistor Q1 provides, from its source, the back-gate voltage to the N well 28 by way of the N+ layer 29. Since the N well 28 is surrounded by the P− substrate 10, a parasitic diode Di is formed. Although this diode Di is small, when there are tens to hundreds of such diodes, they act as a comparatively large diode. Thus, since the power-source line for the transistor Q1 has a static protection diode of a comparatively large capacity, the power supply system for the transistor Q1 is used as the power supply system 14B and 15B.

On the other hand, since the transistor Q2 does not provide the back-gate voltage to the N well, no parasitic diode is formed. Accordingly, the power supply system for the transistor Q2 is used as the power supply system 14C and 15C. The transistors Q1 and Q2 both have their gate (P+ region) connected to the power-source lines 14B and 14C, respectively. Although the above description deals only with the corner area 4c, the other corner areas 4a, 4b, and 4d have the same structure.

What is claimed is:

1. A semiconductor integrated circuit device having a plurality of types of power supply systems, wherein, in a corner area of a semiconductor integrated circuit chip, a diode region is formed that consists of a P region and an N region, and, on said diode region, a power-source line is laid so that said power-source line and said diode region are coupled and thereby a static protection diode is added to said power supply systems.

2. A semiconductor integrated circuit device as claimed in claim 1, wherein a plurality of diode regions are formed along a predetermined direction, and a pair of power-source/ground lines for a power supply system having low resistance to static electricity is so arranged as to have as many intersections as possible with said plurality of diode regions.

3. A semiconductor integrated circuit device as claimed in claim 2, wherein said pair of power-source/ground lines runs in an L-shaped path along outer edges of the corner area of said semiconductor integrated circuit chip, and said diode regions include a group of diode regions that are formed along a first direction perpendicular to said pair of lines and a group of diode regions that are formed along a second direction perpendicular to said first direction.

4. A semiconductor integrated circuit device as claimed in claim 2, wherein there are a plurality of pairs of power-source/ground lines, of which a first pair runs in an L-shaped path along inner edges of the corner area of said chip and of which a second pair runs in an L-shaped path along outer edges of the corner area of said chip, and said diode regions are formed, for said first pair of lines, only along a first direction and, for said second pair of lines, both in said first direction and in a second direction perpendicular to said first direction.

* * * * *